United States Patent
Ye et al.

(10) Patent No.: US 11,353,827 B1
(45) Date of Patent: Jun. 7, 2022

(54) OPTICAL LOCAL OSCILLATOR FOR ALL-OPTICAL TIME SCALES, AND ASSOCIATED TIMEKEEPING METHODS

(71) Applicants: The Regents of the University of Colorado, a body corporate, Denver, CO (US); Government of the United States of America as represented by the Secretary of Commerce, Gaithersburg, MD (US)

(72) Inventors: Jun Ye, Louisville, CO (US); Eric G. Oelker, Boulder, CO (US); William R. Milner, Boulder, CO (US); John M. Robinson, Henderson, NV (US); Colin J. Kennedy, Boulder, CO (US); Tobias Bothwell, Boulder, CO (US); Dhruv Kedar, Boulder, CO (US); Terry Brown, Lafayette, CO (US)

(73) Assignees: The Regents of the Univ. of Colorado, a body corp., Denver, CO (US); Government of the United States of America, as represented by the Secretary of Commerse, Gaithersburg, MD (US)

( * ) Notice: Subject to any disclaimer, the term of this patent is extended or adjusted under 35 U.S.C. 154(b) by 0 days.

(21) Appl. No.: 17/127,616

(22) Filed: Dec. 18, 2020

Related U.S. Application Data (60) Provisional application No. 62/949,850, filed on Dec. 18, 2019.

(51) Int. Cl.
  *G04F 5/14* (2006.01)
  *H03L 7/26* (2006.01)
  (Continued)

(52) U.S. Cl.
  CPC .......... *G04F 5/14* (2013.01); *G01J 3/00* (2013.01); *G01J 3/108* (2013.01); *G01J 3/45* (2013.01);
  (Continued)

(58) Field of Classification Search
  CPC ...... H03L 7/26; G04F 5/14; G01J 3/45; G01J 3/00; G01J 3/108; H01L 27/15; H04B 10/516
  (Continued)

(56) References Cited

U.S. PATENT DOCUMENTS

2012/0155584 A1* 6/2012 Wilkinson ............... G04G 7/00
                                                              375/354

OTHER PUBLICATIONS

Hagemann, et al., "Ultra-Stable Laser With Average Fractional Frequency Drift Rate Below", JILA, National Institute of Standards and Technology and University of Colorado, Department of Physics, complied Oct. 8, 2018, pp. 1-5.
(Continued)

*Primary Examiner* — Arnold M Kinkead
(74) *Attorney, Agent, or Firm* — Lathrop GPM LLP (57) ABSTRACT

The frequency stability of an optical local oscillator is improved by locking a laser to a silicon Fabry-Perot cavity operating at a temperature near 124 K, where the coefficient of thermal expansion of silicon is near zero. The cavity is mounted inside a cryostat housed in a temperature-stabilized vacuum system that is surrounded by an isolating enclosure and supported by an active vibration platform. Laser light is steered with a superpolished mirror toward a superpolished focusing optic that couples the laser light into the cavity. Light reflected from the cavity is used to stabilize the laser via the Pound-Drever-Hall technique, while light transmitted through the cavity is used to stabilize the laser power. A resonant transimpedance amplifier allows the laser power to
(Continued)

be reduced, which reduces heating of the cavity caused by residual absorption of the light.

20 Claims, 8 Drawing Sheets

(51) Int. Cl.
 *G01J 3/10* (2006.01)
 *G01J 3/00* (2006.01)
 *H01L 27/15* (2006.01)
 *G01J 3/45* (2006.01)
 *H04B 10/516* (2013.01)

(52) U.S. Cl.
 CPC ............ *H01L 27/15* (2013.01); *H03L 7/26* (2013.01); *H04B 10/516* (2013.01)

(58) Field of Classification Search
 USPC ............ 331/94.1, 3; 356/300; 359/349, 256, 359/330; 257/84, 82; 349/198; 372/20
 See application file for complete search history.

(56) References Cited

OTHER PUBLICATIONS

Robinson, et al., "Crystalline Optical Cavity at 4K With Thermal Noise Limited Instability and Ultralow Drift", JILA, National Institute of Standards and Technology and University of Colorado, Department of Physics, complied Dec. 11, 2018, pp. 1-4.

Zhang, et al., "Ultrastable Silicon Cavity in a Continously Operating Closed-Cycle Cryostat at 4K", JILA, National Institute of Standards and Technology and University of Colorado, Department of Physics, published Dec. 15, 2017, pp. 1-5.

Matei, et al., 1.5 um Lasers With Sub-10 mHz Linewidth, Physical Review Letters, PRL 118,263202 (2017), week endingJun. 30, 2017, JILA, National Institute of Standards and Technology and University of Colorado, Department of Physics, published Jun. 28, 2017, pp. 1-6.

Kessler, et al., "A sub-40 mHZ Linewidth Laser Based on a Silicon Single-Crystal Optical Cavity", JILA, National Institute of Standards and Technology and University of Colorado, Department of Physics, arXiv:1112.3854v2, Physics.optics, Jan. 5, 2012., pp. 1-7.

\* cited by examiner

OPTICAL LOCAL OSCILLATOR FOR ALL-OPTICAL TIME SCALES, AND ASSOCIATED TIMEKEEPING METHODS

RELATED APPLICATIONS

This application claims priority to U.S. Provisional Patent Application No. 62/949,850, filed Dec. 18, 2019 and titled "Optical Local Oscillator for All-Optical Time Scales", the entirety of which is incorporated herein by reference.

STATEMENT REGARDING FEDERALLY SPONSORED RESEARCH OR DEVELOPMENT

This invention was made with government support under grant number FA9550-19-1-0275 awarded by the U.S. Air Force; grant number PHY1734006 awarded by the National Science Foundation; grant number D18AC00037 awarded by DOD/DARPA; and grant number W911NF-16-1-0576 awarded by the U.S. Army Research Office. The government has certain rights in the invention.

SUMMARY

A time scale is a type of timekeeping system that generates a highly stable timing signal for metrological applications. Time scales are typically operated by national metrology institutes (e.g., the National Institute of Standards and Technology) as part of a constructed time standard. For example, international atomic time (TAI) is a constructed time standard formed from a weighted average of timing signals generated by over 400 time scales located in more than 50 laboratories around the world. TAI is the basis for coordinated universal time (UTC), which is the primary time standard used to regulate clocks and times throughout the world.

A time scale typically includes an ensemble of atomic clocks whose outputs are averaged together into a single timing signal that is more stable than those generated by the individual clocks themselves. Each atomic clock outputs a clock signal derived from an atomic frequency reference that periodically steers the frequency of a local oscillator (LO) to an atomic transition frequency. Thus, the atomic frequency reference is a stable oscillator that serves as the timing element for the atomic clock. For averaging times less than that of the periodic steering (e.g. $10^5$ seconds), the stability of the atomic frequency reference is determined by the LO. At longer averaging times, the stability of the atomic frequency reference is typically limited by LO phase noise, duty cycle of the atomic frequency reference, signal-to-noise ratio of the atomic frequency reference, and/or drift.

Many prior-art atomic frequency references, such as cesium and rubidium fountains, use atomic transitions whose frequencies lie in the microwave region of the electromagnetic spectrum. However, optical frequency references, which use atomic transitions in the infrared, optical, or ultraviolet regions of the electromagnetic spectrum, typically achieve orders-of-magnitude greater frequency stability and accuracy than their microwave-based counterparts. Since all the atomic clocks currently used for TAI utilize microwave frequency references, a transition to optical clocks (which utilize optical frequency references) can greatly enhance both the accuracy and stability of TAI, and thus UTC. Such a transition can also advantageously reduce the size and complexity of time scales by reducing the number of atomic clocks that are needed in an ensemble to achieve a desired level of timing error.

To fully incorporate the superior accuracy and stability of an optical frequency reference into a time scale, the optical frequency reference would ideally operate continuously (i.e., with no periods of downtime). However, many prior-art optical frequency references can only operate at a maximum duty cycle of approximately 25% duty cycle (i.e., 6 hours/day). During each period of downtime, which can last one day or more, the timing error is determined primarily by the free-running frequency stability of an optical local oscillator (OLO) whose frequency is steered to an optical transition by the optical frequency reference. Thus, one way to reduce the timing error of an optical clock is to improve the frequency stability of the OLO so that less timing error accumulates during the periods of downtimes.

The present embodiments feature an optical local oscillator (OLO) with improved frequency stability, particularly at averaging times around typical downtime durations (e.g., $10^3$ to $10^6$ seconds). As described in more detail below, the fractional frequency instability of the OLO has been demonstrated to be below $10^{-15}$ for averaging times up to $6 \times 10^5$ seconds (without steering to an atomic frequency reference), more than an order of magnitude better than prior-art OLOs. The OLO may be combined with an optical frequency reference (e.g., a $^{87}$Sr optical lattice) and optical frequency comb to produce an optical clock that outperforms state-of-the-art microwave LOs steered by either microwave or optical frequency standards. As such, the present embodiments advantageously enable both the improvement of prior-art microwave-based time scales, and the development of new all-optical time scales.

Some embodiments of the OLO are based on a silicon Fabry-Perot cavity operating at a temperature near 124 K. OLOs based on cryogenic silicon reference cavities (e.g., Fabry-Perot cavities) have demonstrated frequency stabilities better than all other prior-art free-running OLOs at averaging times below $10^4$ seconds. To further improve the frequency stability, the present embodiments use superpolished optics to reduce scatter, thermal control of the environment (i.e., a vacuum chamber housing the silicon Fabry-Perot cavity) to limit the effect of parasitic etalons, and active power stabilization of light transmitted through the Fabry-Perot cavity to reduce frequency excursions arising from laser intensity fluctuations. The present embodiments also include a resonant transimpedance amplifier that may be used to reduce the amount of light used to lock a laser to the Fabry-Perot cavity.

As an experimental demonstration of the present embodiments, an OLO steered daily by an $^{87}$Sr optical lattice clock over a thirty-four-day data campaign accumulated an estimated time error of only 48±94 ps. During the campaign, the frequency stability of the OLO surpassed that of hydrogen masers in the UTC(NIST) time scale at all averaging times out to multiple days, demonstrating the requisite stability for improved time-scale performance. The continuous availability of the OLO coupled with the on-demand performance of the optical lattice clock makes optical clocks viable for future inclusion in existing time scales, thereby allowing these time scales to advantageously harness the improved accuracy and stability of optical frequency standards.

In embodiments, a timekeeping method includes stabilizing a temperature of a Fabry-Perot cavity to a zero-expansion temperature at which a coefficient of thermal expansion of a material forming a spacer of the Fabry-Perot cavity is near zero. The Fabry-Perot cavity is mounted inside a cryostat housed in a temperature-stabilized vacuum system that is surrounded by an isolating enclosure and supported by an active vibration platform. The timekeeping method also includes steering, with at least one superpolished mirror, laser light toward at least one superpolished focusing optic that couples the laser light into the Fabry-Perot cavity. The timekeeping method also includes locking a frequency of the laser light to the Fabry-Perot cavity based on laser light reflected from the Fabry-Perot cavity. The timekeeping method also includes stabilizing a power of the steered laser light based on laser light transmitted through the Fabry-Perot cavity.

DETAILED DESCRIPTION OF THE EMBODIMENTS

Figure 1:
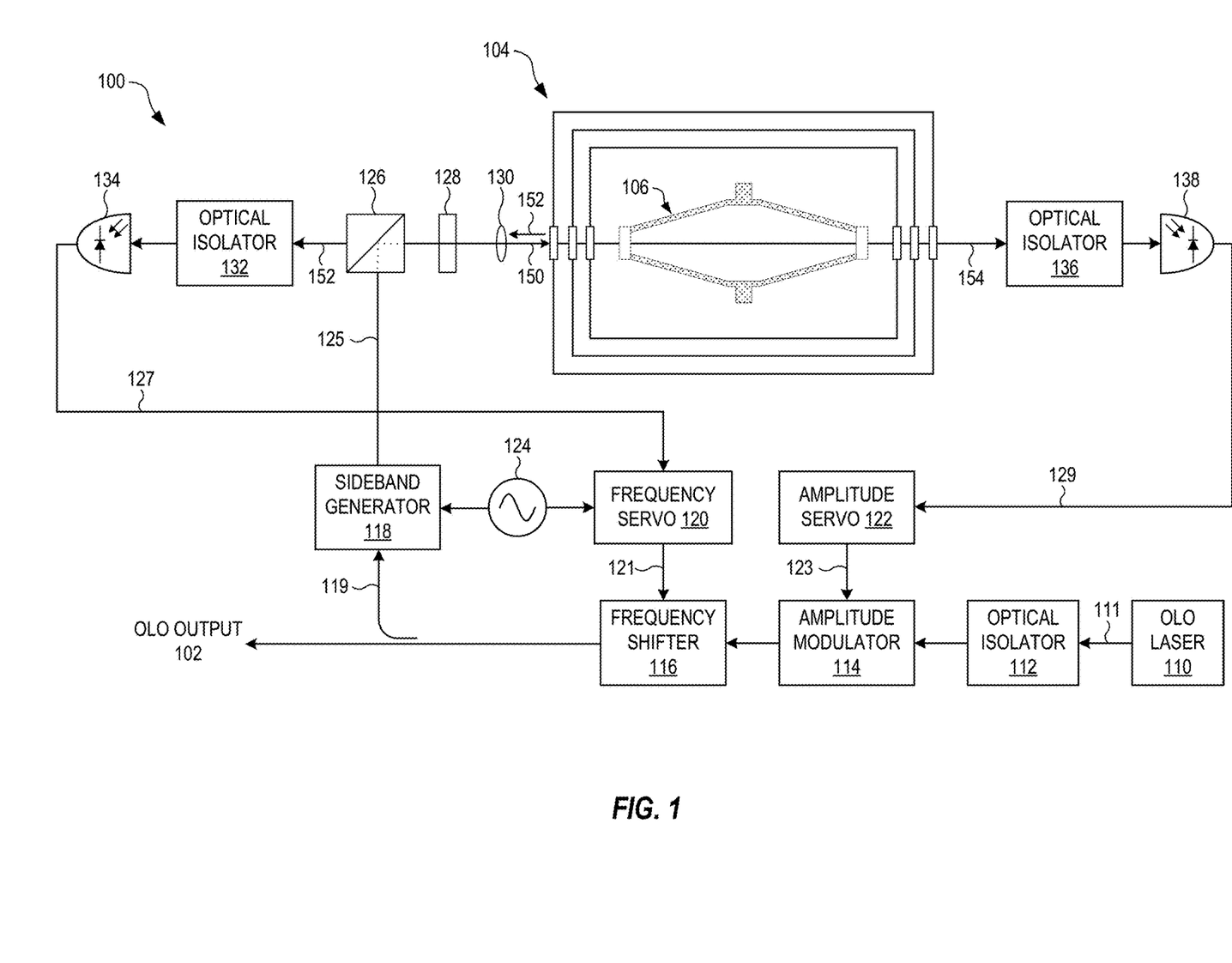
FIG. 1 is a functional diagram of an optical local oscillator (OLO) that may be combined with an optical frequency reference to form an optical clock, in an embodiment.
Figure 2:
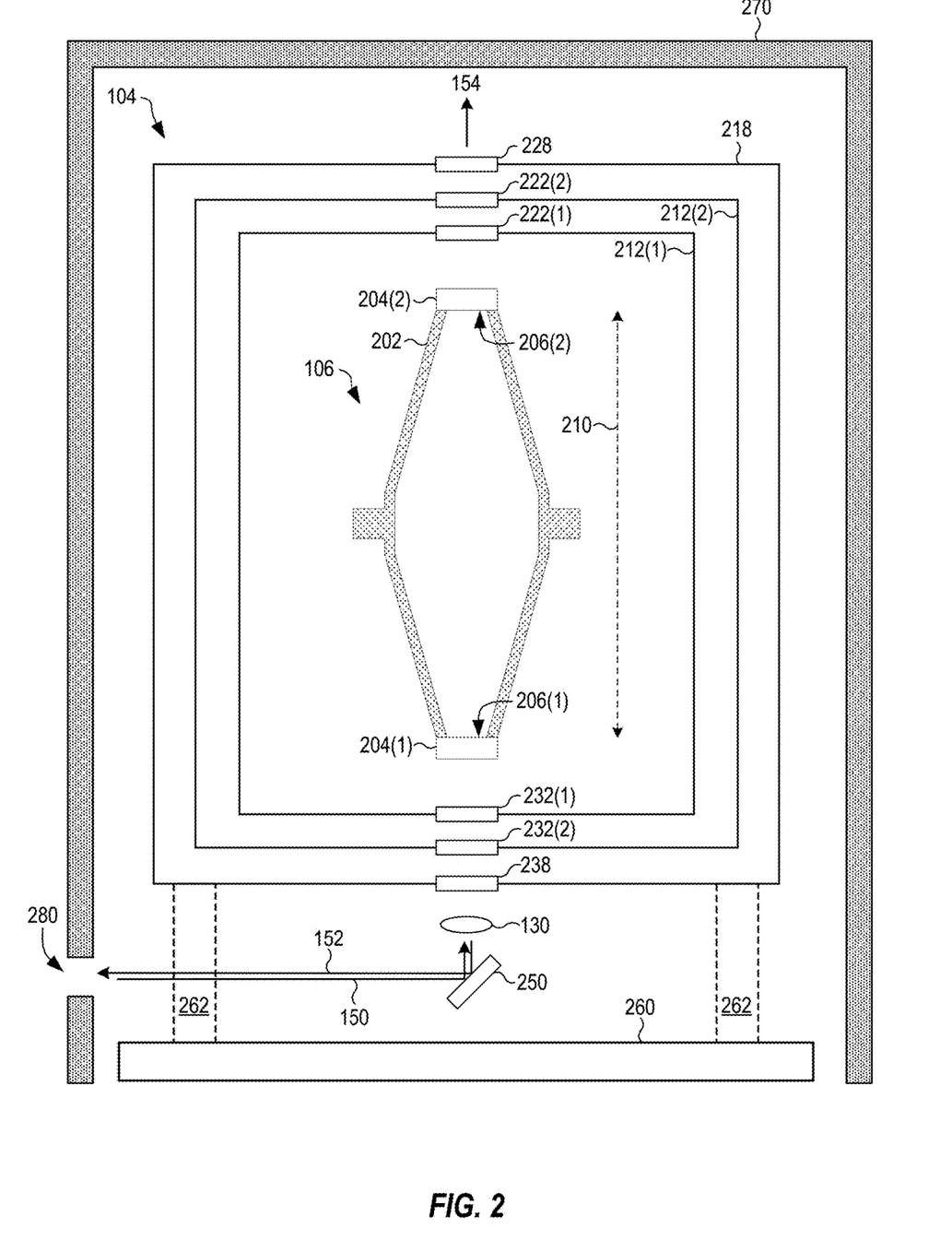
FIG. 2 is a cross-sectional side view of a Fabry-Perot cavity mounted in a cryostat, in an embodiment.
Figure 3:
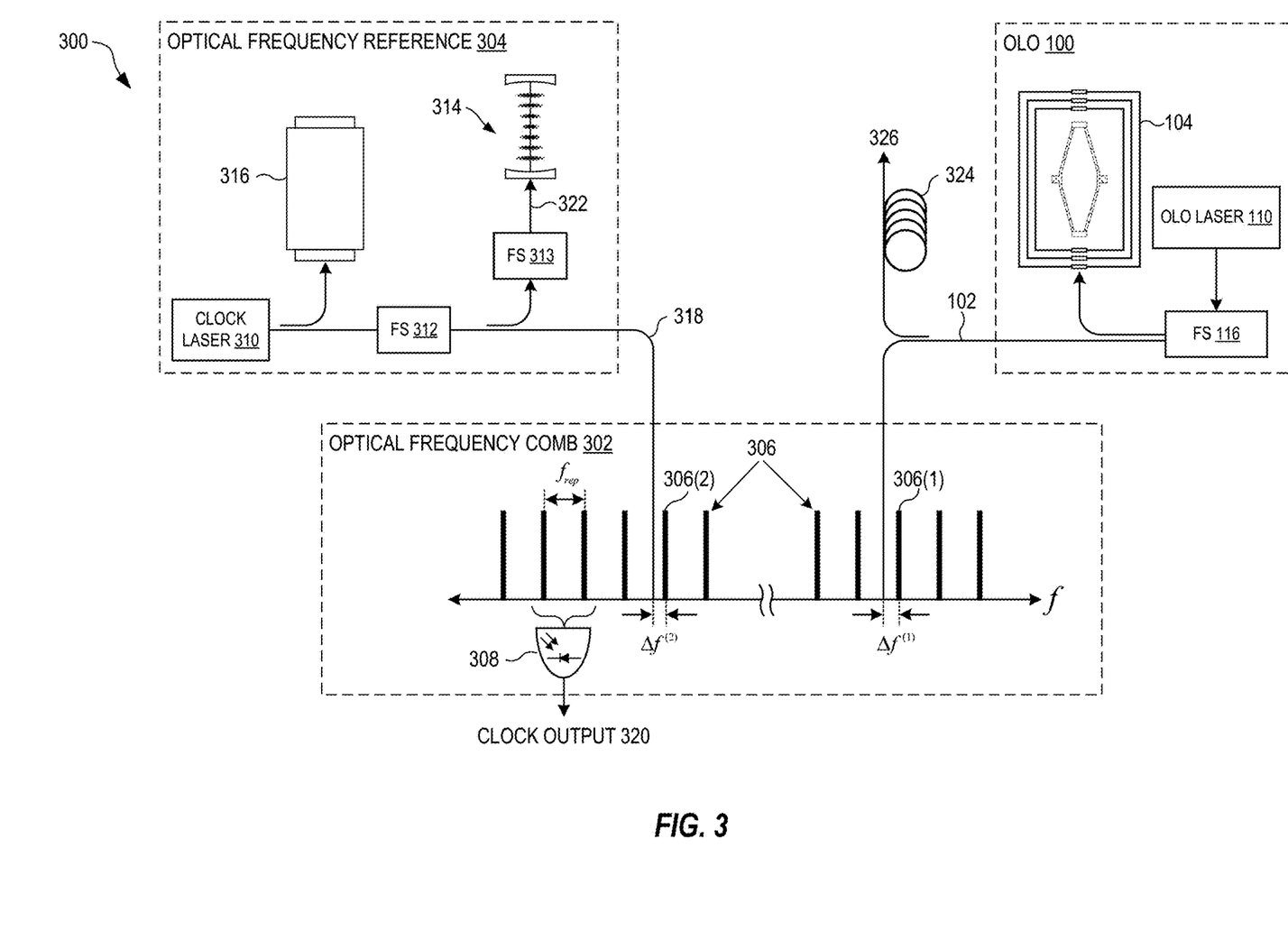
FIG. 3 shows an optical clock that combines the OLO 100 of FIG. 1 with an optical frequency reference to provide stable and accurate timing for averaging times out to several months, or more, in embodiments.

FIG. 1 is a functional diagram of an optical local oscillator (OLO) 100 that may be combined with an optical frequency reference to form an optical clock (e.g., see the optical clock 300 of FIG. 3). The OLO 100 includes a single-frequency OLO laser 110 that is locked to a resonance of a Fabry-Perot cavity 106 to both stabilize a frequency of the OLO laser 110 and narrow a linewidth of the OLO laser 110. That is, the frequency of the OLO 110, when free-running, is less stable than a length of the Fabry-Perot cavity 106 (see cavity length 210 of FIG. 2). To increase the stability of the length of the Fabry-Perot cavity 106, the Fabry-Perot cavity 106 is mounted inside a cryostat 104 that cools the Fabry-Perot cavity 106 to a cryogenic temperature. More details about the cryostat 104 are presented below.

In FIG. 1, the OLO laser 110 is locked to the Fabry-Perot cavity 106 via the Pound-Drever-Hall (PDH) technique. Specifically, a laser output 111 of the OLO laser 110 passes through an optical isolator 112, an amplitude modulator 114 controlled by an amplitude feedback signal 123 to change an amplitude of the laser output 111, and a frequency shifter 116 controlled by a frequency feedback signal 121 to change a frequency of the laser output 111. The frequency shifter 116 and the amplitude modulator 114 change the laser output 111 into an OLO output 102 that is more phase-stable, frequency-stable, and amplitude-stable than the laser output 111. While FIG. 2 shows the OLO laser 110 being locked to the Fabry-Perot cavity 106 using the PDH technique, the OLO laser 110 may be locked to the Fabry-Perot cavity 106 using another technique (e.g., Hänsch-Couillaud locking, frequency-modulation spectroscopy) without departing from the scope hereof.

To implement the PDH technique, sampled light 119 from the OLO output 102 passes through a sideband generator 118 that, when driven by a generator 124, creates frequency sidebands on the sampled light 119. The sideband generator 118 is, for example, an electro-optic modulator that phase modulates the sampled light 119. As known in the art, optical materials (e.g., nonlinear crystals) used for the sideband generator 118 may form an etalon that produces residual amplitude modulation (RAM). Techniques known in the art may be used to actively suppress (e.g., minimize) the RAM produced by the sideband generator 118.

Modulated light 125 outputted by the sideband generator 118 is linearly polarized (e.g., horizontally) such that it reflects off a polarized beamsplitter 126 into the Fabry-Perot cavity 106 as cavity input light 150. A quarter-wave plate 128 converts the polarization of the modulated light 125 from linear to circular. At least one focusing optic 130 couples the cavity input light 150 into the Fabry-Perot cavity 106 such that the cavity input light 150 is mode-matched to the Fabry-Perot cavity 106. The cavity input light 150 is preferably mode-matched to the $TEM_{00}$ mode. However, the cavity input light 150 may be coupled to another mode (e.g., the $TEM_{01}$ mode) without departing from the scope hereof.

When the frequency of the sampled light 119 (i.e., a frequency of the carrier of the modulated light 125) is resonant with a resonance of the Fabry-Perot cavity 106, light builds up and circulates inside the Fabry-Perot cavity 106. Due to the finite reflectivities of the mirrors forming the Fabry-Perot cavity 106 (see mirror coatings 206 in FIG. 2), which introduce loss, some of the light circulating inside the Fabry-Perot cavity 106 leaks out of the Fabry-Perot cavity 106. In FIG. 2, transmitted light 154 leaks out of one end of the Fabry-Perot cavity 106, where it is detected by a transmission photodetector 138. At the other end of the Fabry-Perot cavity 106, cavity output light 152 propagates in a direction opposite to that of the cavity input light 150. The cavity-output light 152 has two components: (1) non-resonant cavity input light 150 that reflects off an input of the Fabry-Perot cavity 106, and (2) resonant cavity input light 150 that circulates inside the Fabry-Perot cavity 106 and leaks out the input of the Fabry-Perot cavity 106. The focusing optic 130 collimates the cavity output light 152, and the quarter-wave plate 128 converts the polarization of the cavity output light 152 from circular to linear (e.g., vertically) such that it passes through the polarized beamsplitter 126. The cavity output light 152 is then detected by a reflection photodetector 134.

A modulated reflection signal 127 outputted by the reflection photodetector 134 is demodulated by a frequency servo 120 (e.g., by a double-balanced mixer inside the frequency servo 120) at the same frequency used to drive the sideband generator 118. Thus, the frequency servo 120 is also driven by the generator 124, and a phase shifter (not shown) may be controlled to select between in-phase and quadrature components of the modulated reflection signal 127. The in-phase component, which crosses zero where the frequency of the sampled light 119 equals a resonant frequency of the resonance of the Fabry-Perot cavity 106, is filtered and processed (e.g., via proportional, integral, and derivative terms) to generate the frequency feedback signal 121 that controls the frequency shifter 116.

The frequency shifter 116 may be an acousto-optic modulator (AOM) driven by a radio-frequency (RF) signal whose frequency is selected according to the frequency feedback signal 121. The RF signal may be generated by a voltage-controlled oscillator driven by the frequency feedback signal 121, wherein the frequency feedback signal 121 is an analog signal. Alternatively, the RF signal may be digitally generated (e.g., via direct digital synthesis) and frequency-controlled, wherein the frequency feedback signal 121 is a digital signal. However, the frequency shifter 116 may be any other type of frequency shifter without departing from the scope hereof, such as an electro-optical modulator driven to implement serrodyne frequency shifting, or frequency shifting via a time-varying Pancharatnam phase. Frequency shifter 116 may also be implemented as a laser that is phase locked to the laser output 111 at an offset frequency determined by the frequency feedback signal 121.

The frequency shifter 116 responds to the frequency feedback signal 121 quickly enough to ensure that the laser output 111 can be locked to the Fabry-Perot cavity 106 with a bandwidth high enough to narrow the linewidth of the laser output 111. Typically, a locking bandwidth larger than the free-running linewidth of the OLO laser 110 is selected. For example, when the OLO laser 110 is a distributed feedback (DFB) fiber laser with a free-running linewidth of 100 Hz, and the frequency shifter 116 is an AOM, a locking bandwidth greater than 100 kHz can be achieved. When the OLO laser 110 contains a mechanism for controlling the frequency of the laser output 111, all or part of the frequency feedback signal 121 may be applied directly to the OLO laser 110. For example, the OLO laser 110 may contain an internal lasing cavity whose length is controllable via a piezoelectric transducer to change the frequency of the laser output 111. In this case, the external frequency shifter 116 may not be needed. However, the frequency-control mechanism internal to the OLO laser 110 may not be fast enough to achieve a sufficiently high locking bandwidth. In this case, the frequency-control mechanism may be used for low-frequency steering of the laser output 111, and the frequency shifter 116 may be used for high-frequency steering of the laser output 111.

An amplitude servo 122 stabilizes a power of the transmitted light 154, which advantageously reduces frequency drift of the OLO output 102 that arises from an intensity-dependent frequency shift of the cavity resonances. The amplitude servo 122 compares a transmission signal 129 outputted by the transmission photodetector 138 to a stable DC reference signal (e.g., as generated by a voltage reference) to generate an error signal. The error signal is then filtered and processed (e.g., via proportional, integral, and derivative terms) to generate the amplitude feedback signal 123 that controls the amplitude modulator 114. The amplitude modulator 114 may be, for example, an electrooptic amplitude modulator (i.e., an electrooptic polarization rotator followed by a polarizer). Alternatively, the amplitude modulator 114 may be an AOM driven by an RF signal whose amplitude is selected according to the amplitude feedback signal 123. The amplitude of the RF signal may be controlled with a voltage-controlled variable attenuator, wherein the amplitude feedback signal 123 is an analog signal. Alternatively, the amplitude of the RF signal may be controlled digitally (e.g., via a digital step attenuator), wherein the amplitude feedback signal 123 is a digital signal. In some embodiments, both the amplitude modulator 114 and the frequency shifter 116 are implemented as one AOM driven by one RF signal whose amplitude is selected according to the amplitude feedback signal 123, and whose frequency is selected according to the frequency feedback signal 121.

An optical isolator 136 may be placed in front of the transmission photodetector 138 to prevent scattered light (i.e., diffuse and specularly reflected light) from the transmission photodetector 138 from propagating back into the Fabry-Perot cavity 106. Similarly, an optical isolator 132 may be placed in front of the reflection photodetector 134 to prevent scattered light from the reflection photodetector 134 from propagating back into the Fabry-Perot cavity 106. Furthermore, the transmission photodetector 138 may be oriented at a slight angle with respect to an optical axis of the transmitted light 154 (i.e., the transmitted light 154 does not impinge of the transmission photodetector 138 at normal incidence) so that the specular reflection is steered away from the Fabry-Perot cavity 106. The reflection photodetector 134 may be similarly oriented.

The Fabry-Perot cavity 106 and cryostat 104 of FIG. 1 may be provided as a stand-alone system that is configured to cooperate with the remaining components of the OLO 100 (which may be provided by a third party).

FIG. 2 is a cross-sectional side view of the Fabry-Perot cavity 106 mounted in the cryostat 104. The Fabry-Perot cavity 106 is formed from a spacer 202 to which a first mirror 204(1) and a second mirror 204(2) are affixed (e.g., via optical contact bonding) in a counter-facing configuration. One or both of the mirrors 204 may be convex with a radius of curvature selected such that the Fabry-Perot cavity 106 forms a stable optical resonator. Each of the mirrors 204 has deposited thereon a high-reflectivity coating 206 that is selected to give the Fabry-Perot cavity 106 a high finesse. For example, each high-reflectivity coating may be a dielectric stack of alternating layers of $SiO_2$ and $Ta_2O_5$. The finesse may be, for example, 500,000 or more. Alternatively, each of the mirrors 204 may be a crystalline mirror that has reduced thermal noise by operating without a high-reflectivity dielectric coating. The cavity length 210, equal to a distance between the high-reflectivity coatings 206, is typically between 1 cm and 50 cm. However, the cavity length 210 may be less than 1 cm, or more than 50 cm, without departing from the scope hereof. In general, a longer cavity length 210 improves the fractional frequency stability of the OLO 100, although the corresponding larger size of the Fabry-Perot cavity 106 may negatively increase sensitivity of the Fabry-Perot cavity 106 to external vibrations.

The cryostat 104 uses liquid nitrogen to cool the Fabry-Perot cavity 106 to a zero-expansion temperature where a coefficient of thermal expansion (CTE) of the material forming the spacer 202 crosses zero. Operating the Fabry-Perot cavity 106 near the zero-expansion temperature advantageously reduces the impact of temperature fluctuations on the cavity length 210, which increases the frequency stability of the OLO 100 (i.e., reduces the fractional frequency instability of the frequency of the OLO output 102, when locked to the Fabry-Perot cavity 106). For mirrors 204 to be contact-bonded to the spacer 202, substrates of the mirrors 204 are formed from the same material as the spacer 202.

In one embodiment, each of the spacer 202, the first mirror 204(1), and the second mirror 204(2) is machined from one piece of single-crystal silicon. As a material with a well-defined crystalline structure, single-crystal silicon has several advantages over other amorphous materials typically used to form spacers and mirror substrates for Fabry-Perot cavities (e.g., ultra-low expansion glass, Zerodur, Pyrex, fused silica, etc.). First, silicon has a zero-expansion temperature near 124 K (and additionally at 17 K), a temperature easily accessible with the cryostat 104. Second, crystalline silicon has a high Young's modulus, and thus can be formed into a structure with a high mechanical Q that suppresses fluctuations in the cavity length 210 due to Brownian motion. Third, silicon is transparent in the infrared. When the OLO laser 110 is, for example operates between 1500 and 1600 nm, the substrates of the mirrors 204 will be transparent, allowing the cavity input light 150 to couple into the Fabry-Perot cavity 106, and allowing the cavity output light 152 and the transmitted light 154 to couple out of the Fabry-Perot cavity 106, with minimal absorption by the substrates.

Each piece of single-crystal silicon may be machined with the <111> axis parallel to a cavity axis of the Fabry-Perot cavity 106 (i.e., parallel to the cavity length 210). The Young's modulus of silicon is highest along this direction, and thus this orientation yields the highest-Q mechanical structure, as compared to other orientations (e.g., the <100> and <110> orientations).

As shown in FIG. 3, the cryostat 104 stabilizes the Fabry-Perot cavity 106 at a temperature near 124 K. At least two thermal shields 212 increase the stability of the cavity length 210 by thermally isolating the Fabry-Perot cavity 106 from a room-temperature vacuum chamber 218 that houses the cryostat 104 and the Fabry-Perot cavity 106. In FIG. 2, an inner thermal shield 212(1) and an outer thermal shield 212(2) are both maintained at temperatures near 124 K using nitrogen gas that is heated from liquid nitrogen (at 77 K) in a dewar, and transferred via hoses to the vacuum chamber 218. Each of the inner and outer thermal shields 212 may be made of copper. The Fabry-Perot cavity 106 and thermal shields 212 are mounted inside the vacuum chamber 218 with thermally isolated, cryogenically compatible materials (e.g., G10) to minimize heat flow between the thermal shields 212, between the inner thermal shield 212(1) and the Fabry-Perot cavity 106, and between the outer thermal shield 212(2) and the vacuum chamber 218. Although FIG. 2 shows the cryostat 104 with only two thermal shields 212, additional thermal shields 212 may be used without departing from the scope hereof.

When the cryostat 104 is configured as described above, the Fabry-Perot cavity 106 is thermally connected to the ambient environment (i.e., room temperature) via an effective low-pass filter whose time constant is 9.8 days, or 850,000 seconds. This time constant is large enough to ensure that fluctuations of the cavity length 210 due to the thermal fluctuations in the ambient environment contribute less than $4\times10^{-16}$ (for a one-day averaging time) to the fractional frequency instability of the OLO 100, assuming that the temperature of the Fabry-Perot cavity 106 is 4.5 mK away from the true zero-expansion temperature.

The cryostat 104 may be alternatively configured to stabilize the Fabry-Perot cavity 106 at a temperature near absolute zero (e.g., 4 K), where the CTE of silicon asymptotically approaches zero. In this case, the cryostat 104 is a closed-cycle cryocooler that uses liquid helium. At least three thermal shields 212 are used to maintain successively lower temperatures from the outside to the inside of vacuum chamber 218. For example, an outer thermal shield 212 may be cooled to a temperature between 30 and 40 K, a middle thermal shield 212 may be cooled to 3.5 K, and an inner thermal shield 212 may be held near 3.75 K. The middle thermal shield 212 may be actively cooled via thermal contact with a mechanically flexible cold finger (not shown in FIG. 2). In addition, a large thermal mass may be placed between the cold finger and the middle thermal shield 212 to passively suppress temperature fluctuations of the cold finger. The large thermal mass may be made, for example, from holmium copper ($HoCu_2$), which has a specific heat 2500 times larger than that of copper at 4 K.

To further increase the stability of the cavity length 210, when operating near 4 K, the outer thermal shield 212 may be actively temperature stabilized. Furthermore, the outer thermal shield 212 may be made of copper, whose thermal conductivity at 40 K is 100 times larger than that of aluminum. A high thermal conductivity helps ensure uniformity of the temperature of the outer thermal shield 212, and thus reduces temperature gradients across the Fabry-Perot cavity 106. Each of the inner and middle thermal shields 212 may also be actively temperature stabilized by controlling a resistive heater affixed thereto. Each of the inner and middle thermal shields 212 may be made from copper, aluminum, or another material with high thermal conductivity, high thermal mass, and high emissivity.

When the outer thermal shield 212 is made of copper, and each of the middle and inner thermal shields 212 is made from aluminum, the thermal time constant of the Fabry-Perot cavity 106 is approximately 2000 seconds, which is smaller than the time constant achieved when stabilizing the Fabry-Perot cavity 106 near 124 K. The discrepancy is due to the fact that most materials tend to have smaller thermal masses at temperatures approaching absolute zero.

Regardless of the temperature at which the Fabry-Perot cavity 106 is stabilized, the vacuum chamber 218 may be evacuated with a pump to a pressure below $10^{-9}$ mbar. To minimize sensitivity to seismic motion and external vibrations caused by vacuum equipment connected to the cryostat 104 (e.g., vacuum pumps), it is preferable to mount the Fabry-Perot cavity 106 vertically (i.e., with the cavity length 210 parallel to gravity, as shown in FIG. 2). When the Fabry-Perot cavity 106 is made of <111> silicon, it is also preferable to support the Fabry-Perot cavity 106 at three points near its midplane (i.e., halfway between the first and second mirrors 204) that align with the 120 degree rotational symmetry of axes of the silicon. However, the Fabry-Perot cavity 106 may be mounted in another configuration without departing from the scope hereof.

To further reduce temperature fluctuations, the vacuum chamber 218 may be actively temperature-stabilized. The vacuum chamber 218 may also be surrounded by an isolating enclosure 270 that blocks air currents in the ambient environment from directly impinging on the vacuum chamber 218, and thus improves the temperature stabilization of the vacuum chamber 218 by isolating the temperature of the vacuum chamber 218 from temperature fluctuations of the surrounding air. The isolating enclosure 270 also improves the stability of the optical path length between the OLO laser 110 and the vacuum chamber 218. The isolating enclosure 270 may have one or more holes 280 through which the cavity input light 150 and the cavity output light 152 may pass. Although not shown in FIG. 2, the isolating enclosure 270 may have additional holes through which, for example, the transmitted light 154, fiber-optic patch-cords, and/or electrical wires may pass.

To further minimize the effects of acoustic noise, the vacuum chamber 218 may be mounted (e.g., via pedestals 262) on an active vibration platform 260. The isolating enclosure 270 may be lined with acoustic-damping foam to block acoustic noise propagating through the surrounding air from directly impinging on the vacuum chamber 218. The isolating enclosure 270 also helps limit fluctuations of the optical path length between the OLO laser 110 and the vacuum chamber 218 arising from pressure fluctuations in the surrounding air.

To allow light to enter and exit the cryostat 104, the vacuum chamber 218 may include an upper window 228 through which the transmitted light 154 can pass, and a lower window 238 through which the cavity input light 150 and the cavity output light 152 can pass. Similarly, each thermal shield 212 may include a corresponding upper window 222 and lower window 232. As shown in FIG. 2, the upper windows 222, 228 and lower windows 232, 238 may be coaxial with the Fabry-Perot cavity 106. Each of the upper windows 222, 228 and lower windows 232, 238 may be fabricated from a material that is transparent to the cavity input light 150 yet blocks blackbody radiation to limit radiative heating of the Fabry-Perot cavity 106. A size of each of the windows 222, 228, 232, and 238 may be selected to limit a solid angle through which the blackbody radiation can pass.

Each of the windows 222, 228, 232, and 238 may be anti-reflection coated and wedged to prevent the window from acting as an etalon. In addition, each of the upper windows 222, 228 and lower windows 232, 238 may be tilted at a small angle (e.g., a few degrees or less), relative to the optical axis of the Fabry-Perot cavity 106, to prevent a reflection from the window from coupling back into the Fabry-Perot cavity 106.

At least one turning mirror 250 may be located near the at least one focusing optic 130 on the active vibration platform 260. The turning mirror 250 steers the cavity input light 150 toward the Fabry-Perot cavity 106, and steers the cavity output light 152 away from the Fabry-Perot cavity 106. Both the turning mirror 250 and focusing optic 130 may be mounted in conventional optical mounts that are bolted to, and thus supported by, the active vibration platform 260. While FIG. 2 shows only one turning mirror 250, more than one turning mirror 250 may be used. For example, two turning mirrors 250 may be used to control all four degrees of freedom of the cavity input light 150 (i.e., tip, tilt, sideways translation, and vertical translation).

Since the at least one turning mirror 250 and at least one focusing optic 130 are located close to the Fabry-Perot cavity 106, some light scattered off these components may couple into the Fabry-Perot cavity 106, where it can distort the error signal used to lock the OLO laser 110 to the cavity resonance. Such distortion introduces another temperature-dependent source of frequency drift. To minimize scattered light, the front optical surface of the turning mirror 250 and both optical surfaces of the focusing optic 130 may be superpolished, i.e., each of these optical surfaces is polished such that its residual roughness is less than 1 Å rms across the optical surface. This level of surface roughness corresponds to less than 10 ppm of optical scatter per surface. Although the windows 222, 228, 232, and 238 were not superpolished, it is expected that superpolished windows 222, 228, 232, and 238 would further enhance frequency stability. Accordingly, any of the windows 222, 228, 232, and 238 may be superpolished.

The spacer 202, and the substrates of the mirrors 204, may be made from a material other than silicon. As described above, the CTE for many materials approaches zero as temperature approaches absolute zero, and thus can be cryogenically cooled such that the cavity length 210 is insensitive to thermal fluctuations. Materials that are stiff (i.e., have a high Young's modulus) and transparent (at least partially in the visible and infrared parts of the electromagnetic spectrum) include sapphire, quartz, silicon carbide, silicon nitride, diamond, germanium, and gallium arsenide. Any of these materials, or others, may be used to form the spacer 202, and the substrates of the mirrors 204, without departing from the scope hereof.

The cryostat 104 of FIG. 2 may be provided as a stand-alone system configured for the Fabry-Perot cavity 106, as provided by a third party, to be mounted therein. Alternatively, the cryostat 104 and the Fabry-Perot cavity 106 may be provided as a stand-alone system configured to cooperate with the remaining components of FIG. 2, which may be provided by a third party.

Optical Clock Embodiments

FIG. 3 shows an optical clock 300 that combines the OLO 100 of FIG. 1 with an optical frequency reference 304 to provide stable and accurate timing for averaging times out to several months, or more. The optical clock 300 may be used as one of an ensemble of atomic clocks forming a time scale. In fact, the frequency stability of the optical clock 300 is high enough that it may be used by itself as a time scale (i.e., without additional atomic clocks as part of an ensemble). The OLO 100 maintains the time of the optical clock 300 over short and intermediate averaging times (e.g., $10^5$ seconds and less), while the optical frequency reference 304 determines the stability over long averaging times (e.g., greater than $10^5$ seconds). Due to the enhanced stability of the OLO 100 at short and intermediate averaging times, the optical clock 300 can advantageously operate at less than a 100% duty cycle while providing a lower fractional frequency instability than prior-art microwave LOs (e.g., masers). For example, the optical frequency reference 304 may operate for as little as 1 out of every 24 hours (i.e., a 4.2% duty cycle). For clarity, only the cryostat 104 (with the Fabry-Perot cavity 106), OLO laser 110, and frequency shifter (FS) 116 of the OLO 100 are shown in FIG. 3.

The optical frequency reference 304 may be a one-dimensional lattice of laser-cooled neutral atoms 314, as shown in FIG. 1. Here, a portion of the output of a clock laser 310 is used to pre-stabilize the clock laser 310 to a Fabry-Perot cavity 316. A remaining portion of the output of the clock laser 310 is frequency-shifted by a frequency shifter 312 to produce a reference output 318. A portion of the reference output 318 is frequency-shifted by a frequency shifter 313 to generate probe light 322 that probes an optical clock transition of the atoms 314. A clock correction signal derived by probing the atoms 314 is applied to the frequency shifter 313 to steer a frequency of the probe light 322 towards a clock frequency of the optical clock transition. Each of the frequency shifters 312 and 313 may be, for example, an acousto-optic modulator.

In one example of the optical frequency reference 304, neutral $^{87}$Sr atoms 314 are laser-cooled to microkelvin temperatures and trapped in a one-dimensional optical lattice. In this case, the clock transition is the $^1S_0 \rightarrow {}^3P_0$ transition at 698 nm, and the clock laser 310 may be, for example, an external cavity diode laser at this wavelength. However, the optical frequency reference 304 may be based on a different atomic or molecular transition in the infrared, visible, or ultraviolet regions of the electromagnetic spectrum. Thus, while FIG. 3 shows the optical frequency reference 304 as a one-dimensional lattice of laser-cooled neutral atoms 314, the optical frequency reference 304 may be alternatively based on a two-dimensional or three-dimensional lattice of laser-cooled neutral atoms 314. Other species that may be used for laser-cooled neutral atoms 314 include Yb, Ca, and Hg. Alternatively, the optical frequency reference 304 may be based on one or more atomic ions that are laser-cooled and trapped. Examples of such atomic ions include Hg+, Yb+, Al+, and Sr+.

An optical frequency comb 302 with a plurality of comb teeth 306 may be used to transfer the linewidth and frequency stability of the OLO 100 to the frequency of the clock transition, as shown in FIG. 3. For example, when the optical frequency reference 304 is based on the $^1S_0 \rightarrow ^3P_0$ transition of $^{87}$Sr at 698 nm and the OLO 100 operates at 1542 nm, the optical frequency comb 302 may be configured with a spectrum that extends below 698 nm and above 1542 nm. A first comb tooth 306(1) may be phase-locked to the OLO output 102 at 1542 nm at a first offset-locking frequency $\Delta f^{(1)}$, thereby transferring the phase noise and frequency stability of the OLO 100 to the first comb tooth 306(1). Although not shown in FIG. 3, the optical frequency comb 302 has a carrier-envelope-offset (ceo) frequency $f_{ceo}$ that may be detected with an f–2f interferometer and phase-locked to a microwave frequency reference. With $f_{ceo}$ phase-locked in this manner, phase-locking the first comb tooth 306(1) to the OLO output 102 transfers the phase noise and frequency stability of the OLO 100 to all other comb teeth 306 at all other wavelengths in the spectrum of the optical frequency comb 302.

Using a heterodyne beat $\Delta f^{(2)}$ between the reference output 318 and a second comb tooth 306(2) at 698 nm, the reference output 318 may be phase-locked to the second comb tooth 306(2) by controlling the frequency of the reference output 318 via the frequency shifter 312. This phase lock transfers the frequency stability of the OLO output 102 to the reference output 318, for all averaging times.

As another example of how the optical frequency comb 302 may be used when the optical frequency reference 304 is based on the $^1S_0 \rightarrow ^3P_0$ clock transition of $^{87}$Sr at 698 nm, the optical frequency comb 302 may be configured with an octave-spanning spectrum that does not extend to 698 nm. In this case, a portion of the optical frequency comb 302 near 1396 nm may be frequency-doubled to generate the second comb tooth 306(2) at 698 nm.

The comb teeth 306 are equally spaced by a repetition rate $f_{rep}$ that can be detected with a photodetector 308 to produce an electronic clock output 320 whose frequency stability, for all averaging times, is determined by the OLO 100. Although not shown in FIG. 3, the clock correction signal used to control the frequency shifter 313 may also be used to correct the clock output 320 so that at long averaging times, the clock output 320 displays the long-term stability of the optical frequency reference 304 rather than the OLO 100.

To improve the frequency stability of the optical clock 300 when the optical frequency reference 304 is unavailable (i.e., during downtime), the frequency of the OLO 100 may be steered using a predictive model. The predictive model may be based on a Kalman filter that estimates, at a given time, a next frequency of the OLO 100 based on prior measurements of the frequency. As described in more detail below, drift in the OLO frequency between daily measurements can be modeled using a quadratic function. The model prediction is a state vector that is updated epoch-by-epoch when the optical frequency reference 304 is running.

In one embodiment, the OLO output 102 is coupled into a fiber-optic cable 324 that forms part of a phase-stabilized fiber-optic link that transfers the OLO output 102 over long distances (e.g., several kilometers). An output 326 of the fiber-optic link may then be used with a remote optical frequency comb that is similar to the optical frequency comb 302 of FIG. 3. Thus, the OLO 100 need not be physically proximate to the optical frequency comb 302 or the optical frequency reference 304 to form part of an optical clock or time scale. This embodiment is straightforward to implement when the OLO laser 110 operates at a wavelength compatible for optical communication, such as the C-band (1530-1565 nm) or L-band (1565-1625 nm).

In another embodiment, the clock correction signal is used to adjust the first offset-locking frequency $\Delta f^{(1)}$. In this case, the optical frequency reference 304 may operate without the frequency shifter 313, wherein the reference output 318 and probe light 322 have the same frequency. One benefit of this embodiment is that the clock output 320 displays the long-term stability of the optical frequency reference 304 without correction.

Figure 4:
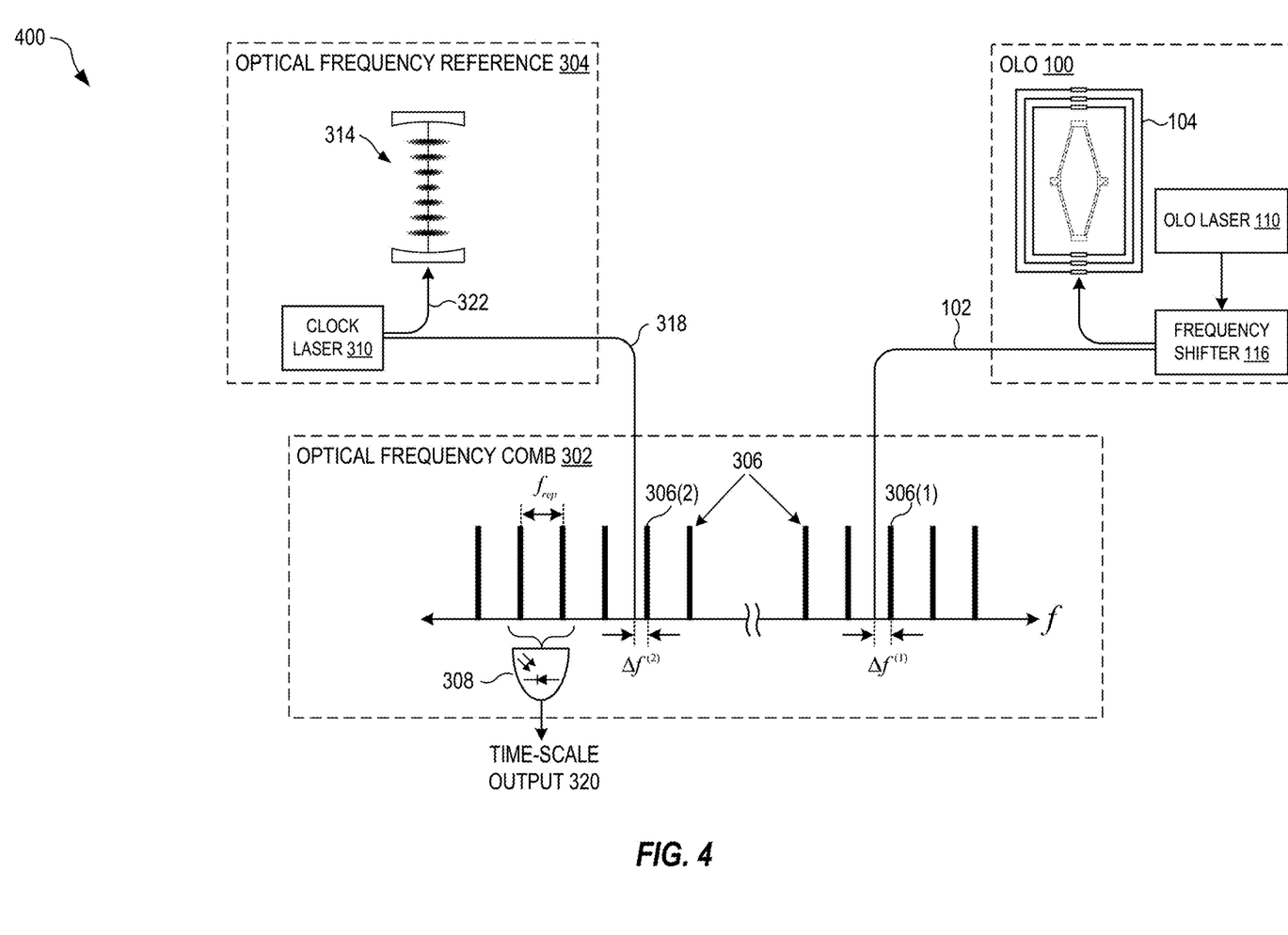
FIG. 4 shows an optical clock that is similar to the optical clock of FIG. 3 except that the optical frequency reference operates without frequency shifters and a Fabry-Perot cavity, in an embodiment.

FIG. 4 shows an optical clock 400 that is similar to the optical clock 300 of FIG. 3 except that the optical frequency reference 304 operates without the frequency shifters 312, 313 and Fabry-Perot cavity 316. In this case, the clock laser 310 is directly phase-locked to the second comb tooth 306(2) at a second offset-locking frequency $\Delta f^{(2)}$ with a bandwidth large enough that the clock laser 310 inherits the narrow linewidth of the OLO 100. The second offset-locking frequency $\Delta f^{(2)}$ may be selected so that the probe light 322 is resonant with the clock transition. The clock correction signal may then be used to adjust the first offset-locking frequency $\Delta f^{(1)}$ so that the clock laser 310 is steered toward the clock frequency. In this case, the clock output 320 displays the long-term stability of the optical frequency reference 304 without correction.

In other embodiments, the stability of the OLO 100 is transferred to the optical frequency reference 302 without the optical frequency comb 302, wherein the optical frequency comb 302 is used only to generate the clock signal 320. For example, when the clock laser 310 and the OLO laser 110 have frequencies that are close (e.g., <100 GHz), the clock laser 310 can be directly phase-locked to the OLO output 102 without the optical frequency comb 302. In this case, the OLO 100 operates similarly to the Fabry-Perot cavity 316 of FIG. 3. The second comb tooth 306(2) may then be phase-locked to either the reference output 318 or the OLO output 102 to generate the clock output 320. Alternatively, when the OLO output 102 has a frequency sufficiently close to that of a harmonic (e.g., a second harmonic) of the clock laser 310, the clock laser 310 may be controlled so that its harmonic is phase-locked to the OLO output 102. Alternatively, when a harmonic (e.g., a second harmonic) of the OLO output 102 has a frequency sufficiently close to that of the clock laser 310, the clock laser 310 may be phase-locked to the harmonic of the OLO laser 110. For example, when the OLO 110 operates at 1396 nm and the clock laser 310 operates at 698 nm, the OLO output 102 may be frequency-doubled to 698 nm, wherein the clock laser 310 is phase-locked to the frequency-doubled OLO output 102.

Optical Clock Performance

FIGS. 5-8 demonstrate performance of the OLO 100 over a thirty-four-day data campaign spanning from a modified Julian date (MJD) of 58430 to 58464. For this data, the optical frequency reference 304 was based on laser-cooled neutral $^{87}$Sr atoms trapped in a 1D optical lattice. A clock laser 310 at 698 nm probed the $^1S_0 \rightarrow ^3P_0$ clock transition at this wavelength. The Fabry-Perot cavity 106 of the OLO 100 was made of single-crystal silicon, and was cryogenically cooled to 124 K in the cryostat 104. The Fabry-Perot cavity 106 and cryostat 104 were configured as described above for FIGS. 1 and 2. The optical frequency comb 302 was based on a Er:fiber laser with a repetition rate $f_{rep}$ of approximately 250 MHz, and $f_{ceo}$ phase-locked to 35 MHz. RAM generated by the sideband generator 118 was actively suppressed. The clock output 320 was compared, via a microwave fiber link, to AT1, a free-running microwave time scale at the Boulder campus of the National Institute for Standards and Technology (NIST). AT1 features a 95% uptime, allowing nearly continuous monitoring of the OLO 100 over the data campaign.

Figure 5:
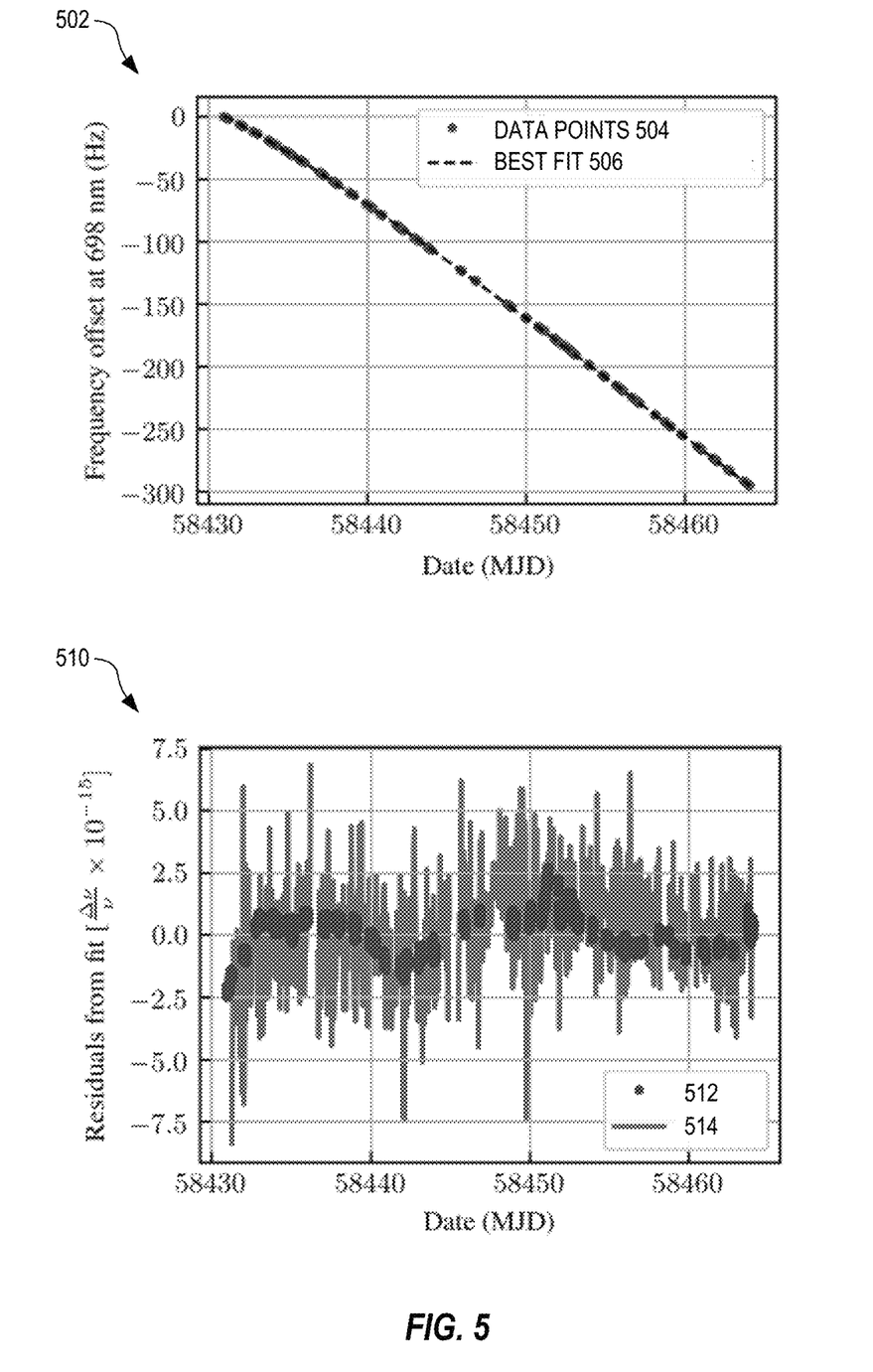
FIG. 5 shows a frequency record of the OLO of FIG. 1 over a thirty-four-day data campaign.

FIG. 5 shows a frequency record 502 of the OLO 100 over the thirty-four-day data campaign. Specifically, data points 504 of the frequency record 502 (shown as circles) represent measurements of the frequency of the OLO 100 relative to the optical frequency reference 304. The optical frequency reference 304 ran daily except for MJDs 58444 and 58447. Three days before the first measurement, the optical power incident on the Fabry-Perot cavity 106 was changed to reset an intensity noise servo. The frequency evolution of the OLO 100 after adjusting the incident optical power is well modeled by a constant linear drift plus an exponential relaxation term, i.e., $a+bt+ce^{-t/d}$. A best-fit line 506 shows the data points 504 fit to this drift model, where a=24.16 Hz, b=−9.632 Hz/day, and d=7.813 days. A residuals plot 510 show the residuals 512 of the best-fit line 506. A line 514 in the residuals plots 510 shows similar residuals based on frequency measurements made relative to AT1 and corrected with the best-fit line 506.

During the interval between clock operation on MJD 58441 and 58442, two frequency jumps on the OLO were identified with a combined amplitude of $5.02 \times 10^{-15}$. A correction of the same magnitude is applied to all data after this step when performing the analysis presented herein. No significant change in the long-term drift trend of the OLO 100 was observed following these excursions.

The performance of a time scale is typically compared to a reference time scale with significantly lower timing uncertainty. Since no such time scale exists, the $^{87}$Sr optical frequency reference 304 is treated as an ideal frequency reference, and the performance of the OLO 100 is inferred by examining the fractional frequency offset between the steered OLO frequency record and the clock transition frequency, hereafter referred to as the prediction error. The time error of the optical clock 300 is defined as the integral over time of the prediction error.

If the frequency record 502 was continuous, the time error could be determined to within the measurement precision of the optical frequency reference 304. However, a finite gap of time separates the measurements in the frequency record 502, ranging from a five-second interrogation cycle of the optical frequency reference 304 to twenty-four hours between daily measurements. Most of the time error accumulates during the longer gaps, when the Kalman filter must accurately predict changes in the OLO frequency without new measurement data from the optical frequency reference 304. The time error contribution from a gap is simply the gap duration multiplied by the mean prediction error during this interval. However, the latter quantity cannot be determined exactly from the available data. Instead, the mean prediction error is estimated by averaging the values before and after the gap and multiplying the average value by the gap duration to compute an estimated time error. A 1σ confidence interval is calculated for the estimated time error through repeated simulations of the OLO frequency during each gap to determine the uncertainty in the estimation of the prediction error.

Figure 6:
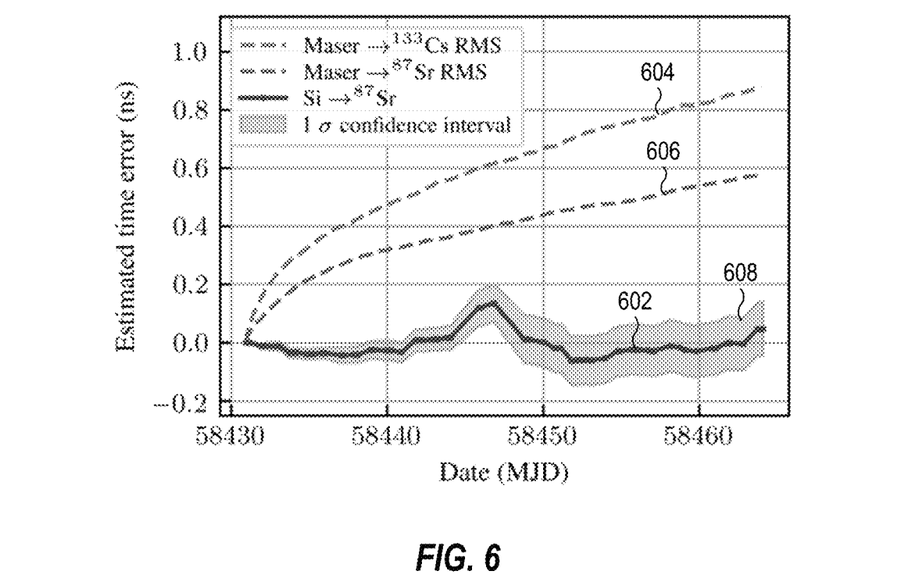
FIG. 6 shows the integrated time error of optical clock of FIG. 3, as determined from the residuals of the frequency record of FIG. 5.

FIG. 6 shows the integrated time error 602 of the optical clock 300, as determined from the residuals 512 of FIG. 5. After thirty-four days of integration, the optical clock 300 accumulates an integrated time error 602 of 48±94 ps. FIG. 6 also shows a 1σ confidence interval 608 for the integrated time error 602. For comparison, FIG. 6 also shows an integrated time error 604 estimated for a time scale consisting of a hydrogen maser steered to a $^{133}$Cs fountain for 24 hours/day, and an integrated time error 606 estimated for a time scale consisting of a hydrogen maser steered to an $^{87}$Sr optical lattice clock for 6 hours/day. The integrated time errors 604 and 606 were estimated by computing time errors from repeated simulations, and are represented in FIG. 6 as the RMS spread over a thirty-four-day window. Each of the integrated time errors 604 and 606 is larger than the integrated time error 602 of the optical clock 300.

Figure 7:
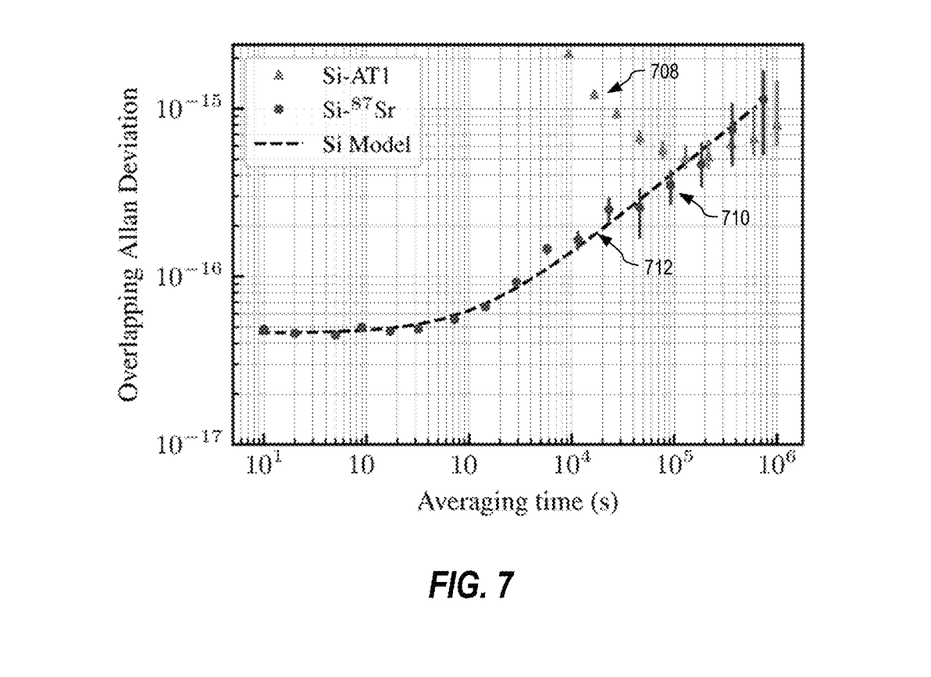
FIG. 7 is a plot of the fractional frequency instability of the OLO of FIG. 1 as a function of averaging time.

FIG. 7 is a plot of the fractional frequency instability of the OLO 100 as a function of averaging time. Data points 710 (circles) are gap-tolerant Allan variances calculated from the residuals 512 of FIG. 5, and correspond to the frequency of the OLO 100 measured relative to the optical frequency reference 304. Data points 710 were fit to a model 712 that includes a known thermal noise floor and a random-walk (RW) frequency noise term, resulting in a fractional frequency instability at long averaging times consistent with $\sigma_{RW}=1.3 \times 10^{-18}\sqrt{\tau}$, where τ is the averaging time in seconds. Data points 708 (triangles) are gap-tolerant Allan variances calculated from the residuals 512 of FIG. 5, and correspond to the frequency of the OLO 100 measured relative to AT1. For averaging times of $10^5$ seconds and higher, the data points 708 and 710 agree within their statistical uncertainties. For shorter averaging times, the data points 708 are consistent with a noise model (not shown) that accounts for instability from the microwave link, the OLO 100, and AT1.

Figure 8:
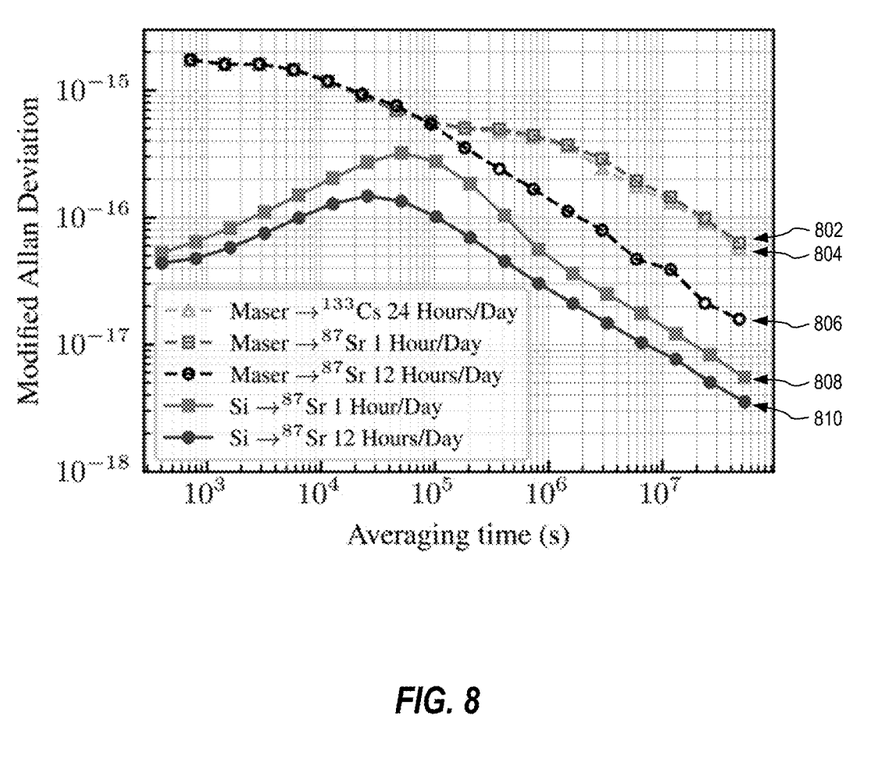
FIG. 8 is a plot of the expected fractional frequency instability of the optical clock of FIG. 3 as a function of averaging time.

FIG. 8 is a plot of the expected fractional frequency instability of the optical clock 300 as a function of averaging time. Data points 810 are modified Allen deviations calculated from a time-scale frequency record that was generated by simulating the OLO 100 being steered by the optical frequency reference 304 for an uptime of 12 hours/day. To generate the time-scale frequency record, a local oscillator frequency record was first generated using the model 712 of FIG. 7 to represent noise, and including the drift model represented by the best fit 506 of FIG. 5. The local oscillator frequency record was then steered according to a simulated optical frequency reference 304, using the same Kalman filtering techniques described above, to generate the time-scale frequency record. Data points 808 are similar to the data points 810, except that the OLO 100 is simulated as being steered by the optical frequency reference 304 for an uptime of only 1 hour/day.

For comparison, FIG. 8 also shows simulated fractional frequency instabilities of atomic clocks that use a hydrogen maser as a local oscillator instead of the OLO 100. Specifically, data points 806 correspond to a maser steered to the optical frequency reference 304 for an uptime of 12 hours/day, data points 804 correspond to a maser steered to the optical frequency reference 304 for an uptime of 1 hour/day, and data points 802 correspond to a maser continuously steered to a $^{133}$Cs fountain clock for 24 hours/day. The stability of the optical clock 300 improves with increased uptime (i.e., higher duty cycle) and reduced noise of the OLO 100, and is reasonably consistent with the expected instability limit from aliased LO noise past $10^6$ seconds. When the optical frequency reference 304 is run at a fixed duty cycle, the steered OLO 100 significantly outperforms the steered maser at all averaging times. Even for an uptime of only one hour/day, the optical clock 300 is more stable than a maser steered at a 50% duty cycle.

The improved stability of the optical clock 300 allows for competitive time-scale performance with significantly relaxed uptime requirements. For example, based on the analysis presented above, a fractional frequency instability of approximately $1.8 \times 10^{17}$ is expected for a thirty-four-day campaign with an average uptime of 6 hours/day. For an uptime of 12 hours/day, the frequency instability of the optical clock 300 is expected to remain at or below the $2 \times 10^{-16}$ level at all averaging times, and is projected to reach an instability below $10^{-17}$ after 85 days of operation. Additional effort on automation should increase the clock duty cycle to above 50%. Furthermore, averaging the outputs of N independent OLOs 100 can reduce the LO instability by a factor of $1/\sqrt{N}$.

Kalman Filtering

To minimize the time error during periods when an optical frequency reference is unavailable, a time-scale local oscillator must have a predictable frequency. The frequency of the local oscillator can then be steered using a predictive model to keep it as close to the value of the optical frequency reference as possible. Kalman filtering techniques are often used to construct such a model based on periodic measurements of the local oscillator frequency against an atomic frequency reference. For a hydrogen maser, a linear model of the form $f(t+\Delta t) = \hat{k}_0 + \hat{k}_1 \Delta t$ is typically used to track its frequency drift over time, where $\hat{k}_0$ is an estimate of the maser frequency at time t and $\hat{k}_1 = df/dt$ is an estimate of the linear-frequency drift rate.

For the OLO 100, a linear model is sufficient to form a time scale with competitive performance. However, the presence of random-walk frequency noise and the exponential term in its frequency drift tend to add a slight curvature to the OLO frequency evolution. Better predictive performance can be obtained by modeling the OLO frequency with a quadratic function of the form $f(t+\Delta t) = \hat{k}_0 + \hat{k}_1 \Delta t + \hat{k}_2 \Delta t^2/2$, where the additional term $\hat{k}_2$ estimates the time derivative of the linear drift rate. As shown below, this function is typically written in matrix form, and the coefficients $\hat{k}_0$, $\hat{k}_1$, and $\hat{k}_2$ form what is known as the state estimate vector.

For the analysis presented in FIG. 6, the separation time between updates of the Kalman filter state vector was $\Delta t = 1$ s. For the $n^{th}$ epoch, the local oscillator frequency at time $t_n$ is predicted using the state estimate vector at time $t_{n-1}$ and its expected evolution over the interval $\Delta t$. Mathematically, $$\begin{pmatrix} \hat{k}_0[n|n-1] \\ \hat{k}_1[n|n-1] \\ \hat{k}_2[n|n-1] \end{pmatrix} = \begin{pmatrix} 1 & \Delta t & \Delta t^2/2 \\ 0 & 1 & \Delta t \\ 0 & 0 & 1 \end{pmatrix} \begin{pmatrix} \hat{k}_0[n-1] \\ \hat{k}_1[n-1] \\ \hat{k}_2[n-1] \end{pmatrix}. \quad (1)$$

The vector $\vec{k}[n \equiv n-1]$ is known as the prior estimate of the state at epoch n. The local oscillator frequency is steered by applying a frequency correction of $\hat{k}_0[n|n-1]$ during each epoch. When no new measurement with the optical frequency reference 304 occurs during an epoch, the new state estimate vector is simply set equal to the prior estimate, or $$\begin{pmatrix} \hat{k}_0[n|n-1] \\ \hat{k}_1[n|n-1] \\ \hat{k}_2[n|n-1] \end{pmatrix} = \begin{pmatrix} \hat{k}_0[n-1] \\ \hat{k}_1[n-1] \\ \hat{k}_2[n-1] \end{pmatrix}. \quad (2)$$

Equations 1 and 2 summarize the behavior of the steering algorithm when the optical frequency reference 304 is offline or non-operational. When the optical frequency reference 304 is operational, and a new frequency measurement is available during epoch n, the fidelity of the model prediction may be assessed by comparing the prior prediction of the OLO frequency $\hat{k}_0[n|n-1]$ with the measurement:

$$\Delta f[n] = y[n] - \hat{k}_0[n|n-1] \quad (3)$$

where y[n] is the measurement of the frequency detuning of the free-running OLO 100 relative to the atomic transition and $\Delta f[n]$ is the prediction error (i.e., the residual detuning after steering the OLO 100). If the optical frequency reference 304 is assumed to be ideal, $\Delta f[n]$ represents the residual frequency fluctuation of the OLO 100 after steering. Following the measurement, the state vector may be updated according to:

$$\begin{pmatrix} \hat{k}_0[n|n-1] \\ \hat{k}_1[n|n-1] \\ \hat{k}_2[n|n-1] \end{pmatrix} = \begin{pmatrix} \hat{k}_0[n-1] \\ \hat{k}_1[n-1] \\ \hat{k}_2[n-1] \end{pmatrix} + \Delta f[n] K_n. \quad (4)$$

The matrix $K_n$, known as the optimal Kalman filter gain for epoch n, determines the relative weight of the measurement and the prior estimate when computing the new state estimate vector, and is optimized using knowledge from past measurements and the known noise properties of the OLO 100.

When computing the optimal Kalman filter gain K, two covariance matrices Q and R, corresponding to process noise and measurement noise, must be specified. Process noise represents uncertainty in the future state of the OLO 100, which was found to be dominated by the random-walk frequency noise which limits the frequency stability of the OLO 100 at 1-day averaging intervals. The process noise matrix Q is defined as:

$$Q = \begin{pmatrix} Q_{11} & 0 & 0 \\ 0 & Q_{22} & 0 \\ 0 & 0 & Q_{33} \end{pmatrix}, \quad (5)$$

where the parameter $Q_{11}$, which corresponds to the random walk noise of the silicon Fabry-Perot cavity 106, is set to $5.1 \times 10^{-36}$ $(s/s)^2$, as based on the random-walk coefficient from the local oscillator noise model in FIG. 7. The parameters $Q_{22}$ and $Q_{33}$, corresponding to random run noise and higher-order noise, are negligible. In practice, $Q_{22}$ and $Q_{33}$ are set to $2.2 \times 10^{-46}$ $(s/s^2)^2$ and $3.5 \times 10^{-57}$ $(s/s^3)^2$, respectively. The prediction error is not particularly sensitive to the values of $Q_{22}$ and $Q_{33}$. It was found that only coarse tuning of these parameters is required to guarantee the performance of the Kalman filter.

Measurement noise represents uncertainty in the current frequency measurement due to relative noise between the optical frequency reference 304 and the OLO 100. The measurement noise matrix R has a single non-zero entry with a value of $2.5 \times 10^{-33}$ $(s/s)^2$, corresponding to the Allan variance of the thermal noise floor of the OLO 100.

Resonant Photodetection

Figure 9:
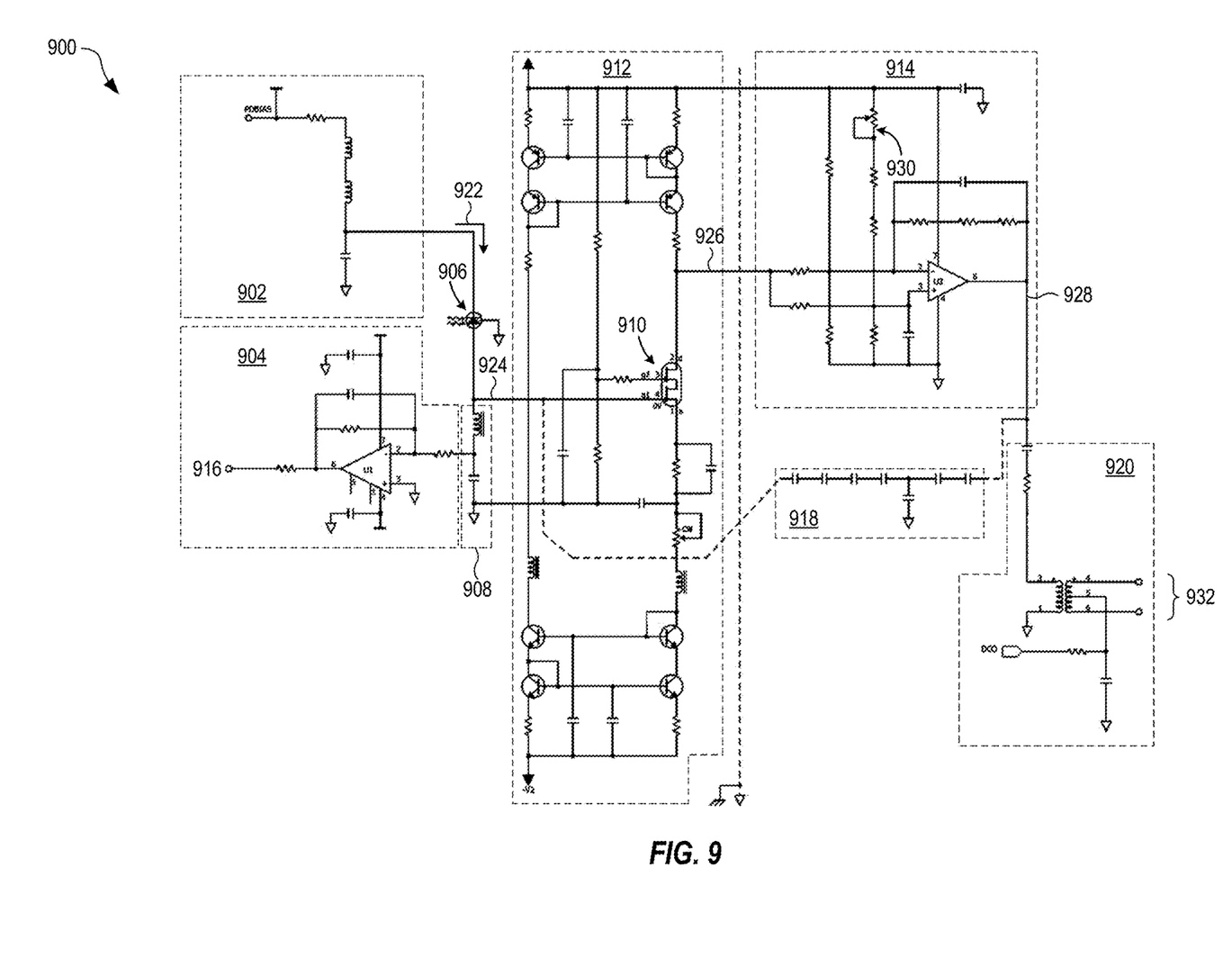
FIG. 9 is a schematic of a resonant transimpedance amplifier, in an embodiment.

FIG. 9 is a schematic of a resonant transimpedance amplifier (RIA) 900 that may be used to resonantly convert a current outputted by the reflection photodetector 134 into a voltage. The RIA 900 is designed to resonantly detect light (e.g., cavity output light 152 or transmitted light 154) at the frequency of the sidebands added to the light by the sideband generator 118 (i.e., near the frequency of the generator 124). The RIA 900 is similar to many conventional transimpedance amplifiers in that it uses feedback to enhance linearity. However, unlike other resonant detection circuits, the RIA 900 uses a phase shifter 914 at the sideband frequency to ensure loop stability. For the PDH technique, the sideband frequency is typically between 1 and 100 MHz. However, the RIA 900 may be used to resonantly detect sidebands at a sideband frequency less than 1 MHz, or more than 100 MHz, without departing from the scope hereof.

Resonant photodetection reduces the amount of active gain needed to detect light. Thus, the RIA 900 has a lower input noise, within the bandwidth of its resonance, as compared to a non-resonant transimpedance amplifier. With this lower input noise, the power of the detected light can be reduced while still ensuring the light is detected at the photon shot-noise level. Specifically, for shot-noised limited detection, the signal-to-noise ratio (SNR) scales as the square-root of the light power. Therefore, decreasing the light power by a scale factor k decreases the SNR by $k^{1/2}$. However, for amplifier-limited detection (i.e., when the noise floor is set by the electronics), the SNR scales linearly with the power, in which case decreasing the light power by k will also decrease the SNR by k.

Reducing the amount of light used with the OLO 100 advantageously reduces residual heating, thereby improving thermal stability. Residual heating may occur from absorption of light propagating through the substrates of the mirrors 204(1) and 204(2), and is a likely contributor to the linear drift shown in the frequency record 502 of FIG. 5. Accordingly, reducing the amount of light used with the OLO 100 may reduce the slope of the best fit 506, which can improve how this linear drift is corrected.

The RIA 900 includes a bias source 902 that injects a DC bias current 922 into the cathode of a photodiode 906. The photodiode 906 may be any type of photodiode, such as an avalanche photodiode, PN photodiode, or PIN photodiode. To detect light at the photon shot-noise level, the photodiode 906 should have no internal gain. The RIA 900 also includes a resonator 908 that resonates at the sideband frequency. In the example of FIG. 9, the resonator 908 is an inductor and capacitor connected in series. In this case, the resonator 908 will typically have a Q between 10 and 1000, and a full-width at half-maximum (FWHM) of 10 kHz to 10 MHz. The FWHM may define the bandwidth of the RIA 900.

The RIA 900 also includes a bias monitor 904 with an output 916 that provides a low-bandwidth (e.g., DC-2.5 kHz) signal for monitoring the DC bias current 922. The input resistor of the bias monitor 904 sinks the DC bias current 922 to a virtual ground. The op-amp U1 ensures that the output 916 has a relatively low impedance, and is therefore isolated from the resonator 908. Where the bias monitor 904 is not needed, it may be replaced with a resistor to ground that sinks the DC bias current 922.

The RIA 900 also includes an input stage 912 that amplifies the resonantly-enhanced voltage 924 between the resonator 908 and the anode of the photodiode 906. To increase gain and bandwidth, an input transistor 910 of the input stage 912 may be a cascode pair, as shown in FIG. 9. The cascode pair be constructed from a dual-gate gallium arsenide (GaAs) metal-semiconductor field-effect transistor (MESFET), such as the NE25139 manufactured by NEC Corporation. However, another type of gain device may be used for the input transistor 910 without departing from the scope hereof.

The RIA 900 also includes the phase shifter 914, which shifts the phase of an amplified signal 926 outputted by the input stage 912. An output 928 of the phase shifter 914 is the same as the amplified signal 926, but shifted by a phase that is adjustable via a trimpot 930. The phase may be selected to ensure stability of the RIA 900.

The output 928 of the phase shifter 914 connects to a feedback path 918 that returns to the input stage 912. The transimpedance gain of the RIA 900 is set by the components in the feedback path 918 which, unlike conventional transimpedance amplifiers, contains no resistive element. The output 928 also connects to an output conditioner 920 that uses a transformer to convert the single-ended output 928 into a differential signal 932. The differential signal 932 may be used as the input to the frequency servo 120 of FIG. 1.

The factor k by which the optical power can be reduced approximately equals the Q of the resonator 908. For non-resonant transimpedance amplifiers, an optical power of tens of microwatts, or more, is usually needed to reach the photon shot-noise limit. When the RIA 900 is used with a resonator 908 having a Q of 100, optical powers below 100 nW can be detected at the photon shot-noise limit. With an even higher Q, the optical power could be reduced more while still ensuring photon shot-noise-limited detection.

One drawback to a higher Q is that the narrower bandwidth of the RIA 900 may reduce the servo bandwidth of a feedback loop that uses the RIA 900. For example, when locking the OLO laser 110 to the Fabry-Perot cavity 106 using the PDH technique, the servo bandwidth may need to be as high as 1 MHz (depending on the free-running linewidth of the OLO laser 110). However, when the resonator 908 has a Q of 1000, the bandwidth of the RIA 900 is only a few tens of kilohertz, which is likely too small to support a servo bandwidth of 1 MHz. In this case, the linewidth of the OLO laser 110 may be narrowed (e.g., to a few hundred hertz) by locking to a second Fabry-Perot cavity. With this narrower linewidth, the OLO laser 110 can then be locked to the Fabry-Perot cavity 106 with a servo bandwidth much less than 1 MHz.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A timekeeping method, comprising:
supporting a Fabry-Perot cavity inside a cryostat housed in a temperature-stabilized vacuum system that is surrounded by an isolating enclosure and supported by an active vibration platform;
stabilizing a temperature of the Fabry-Perot cavity to a zero-expansion temperature at which a coefficient of thermal expansion of a material forming a spacer of the Fabry-Perot cavity is near zero;
steering, with at least one superpolished mirror, laser light toward at least one superpolished focusing optic that couples the laser light into the Fabry-Perot cavity;
locking a frequency of the laser light to the Fabry-Perot cavity based on laser light reflected from the Fabry-Perot cavity; and
stabilizing a power of the laser light based on laser light transmitted through the Fabry-Perot cavity.

2. The timekeeping method of claim 1, further comprising actively suppressing residual amplitude modulation produced by a sideband generator modulating the laser light.

3. The timekeeping method of claim 1, further comprising:
supporting both the at least one superpolished mirror and the at least one superpolished focusing optic with the active vibration platform; and
reducing, with the active vibration platform, external vibrations of the cryostat, the at least one superpolished mirror, and the at least one superpolished focusing optic.

4. The timekeeping method of claim 1, further comprising cryogenically cooling the Fabry-Perot cavity with the cryostat.

5. The timekeeping method of claim 4, further comprising:
thermally isolating the Fabry-Perot cavity with at least one radiation shield of the cryostat; and
transmitting the laser light through an upper window and a lower window of each of the at least one radiation shield, each of the upper window and the lower window being anti-reflection coated, wedged, and tilted at an angle relative to an optical axis of the Fabry-Perot cavity.

6. The timekeeping method of claim 5, further comprising actively stabilizing a temperature of the at least one radiation shield.

7. The timekeeping method of claim 4, wherein said cryogenically cooling includes cryogenically cooling the Fabry-Perot cavity to a temperature at or below 4 K.

8. The timekeeping method of claim 4, wherein said stabilizing the temperature of the Fabry-Perot cavity includes stabilizing the temperature of the Fabry-Perot cavity to a setpoint temperature that is within 10 mK of the zero-expansion temperature.

9. The timekeeping method of claim 1, further comprising:
detecting the laser light reflected from the Fabry-Perot cavity with a reflection photodetector whose optical window is removed; and
detecting the laser light transmitted through the Fabry-Perot cavity with a transmission photodetector whose optical window is removed.

10. The timekeeping method of claim 9, further comprising converting, with a resonant transimpedance amplifier that includes a phase shifter, a current outputted by the reflection photodetector into a voltage.

11. The timekeeping method of claim 1, further comprising reflecting one microwatt, or less, of the laser light from the Fabry-Perot cavity.

12. The timekeeping method of claim 1, further comprising coupling, with the at least one superpolished focusing optic, the laser light into the Fabry-Perot cavity.

13. The timekeeping method of claim 1, further comprising actively stabilizing a temperature of the temperature-stabilized vacuum system.

14. The timekeeping method of claim 1, further comprising periodically steering the frequency of the laser light based on an atomic frequency standard.

15. An optical local oscillator, comprising:
a Fabry-Perot cavity comprising a spacer formed from a spacer material;
a cryostat that supports the Fabry-Perot cavity and stabilizing a temperature of the Fabry-Perot cavity to a zero-expansion temperature at which a coefficient of thermal expansion of the spacer material is near zero;
a temperature-stabilizable vacuum system housing the cryostat;
an active vibration platform that supports the temperature-stabilizable vacuum system;
an isolating enclosure that surrounds the temperature-stabilizable vacuum system;
at least one superpolished focusing optic that couples laser light into the Fabry-Perot cavity;
at least one superpolished mirror that steers the laser light toward the at least one superpolished focusing optic;
a transmission photodetector that detects laser light transmitted through the Fabry-Perot cavity; and
a reflection photodetector that detects laser light reflected from the Fabry-Perot cavity.

16. The optical local oscillator of claim 15,
the at least one superpolished mirror having a residual surface roughness of less than one angstrom root-mean-square; and
each of one or more surfaces of the at least one superpolished focusing optic having a residual surface roughness less than one angstrom root-mean-square.

17. The optical local oscillator of claim 15, the cryostat further comprising at least one radiation shield that thermally isolates the Fabry-Perot cavity.

18. The optical local oscillator of claim 17, the at least one radiation shield comprising copper.

19. The optical local oscillator of claim 15, wherein:
the spacer material comprises single-crystal silicon; and
a wavelength of the laser light is between 1500 and 1600 nm.

20. The optical local oscillator of claim 15, further comprising a resonant transimpedance amplifier that converts a current outputted by the reflection photodetector into a voltage, the resonant transimpedance amplifier including a phase shifter and having a Q of 10 of more.

* * * * *